United States Patent [19]
Liang

[11] Patent Number: 6,153,932
[45] Date of Patent: Nov. 28, 2000

[54] FIX BASE OF INTEGRATED CIRCUIT CHIPSET AND HEAT SINK

[76] Inventor: Robert Liang, No. 28, YangHsiang Road, YangMei, Taoyuan, Taiwan

[21] Appl. No.: 09/373,170
[22] Filed: Aug. 12, 1999
[51] Int. Cl.⁷ .................................................. H01L 23/34
[52] U.S. Cl. ........................................... 257/712; 257/718
[58] Field of Search ..................... 257/712, 718, 257/707, 713, 706, 726, 727; 361/704

[56] References Cited

U.S. PATENT DOCUMENTS

| | | | |
|---|---|---|---|
| 5,276,585 | 1/1994 | Smithers | 257/718 |
| 5,831,829 | 11/1998 | Lin | 257/718 |

*Primary Examiner*—Roy Potter

[57] ABSTRACT

An improved fix base of a heat sink used to dissipate the heat produced by an integrated circuit chipset in a personal computer is disclosed. The fix base includes a rectangular frame, which has two side plates downwards below the bottom of the two opposite sides. Each bottom part of the two opposite inner sides of the two side plates has a fastening hook, respectively. Each of the other two sides of the two side plates has a protruding rod downwards. A plurality of elastic rods are included in the inner side walls, and each elastic rod includes a protruding part at the bottom. The heat sink is inserted into the rectangular frame and then the chipset is hooked at the two respective sides by the fastening hooks. The protruding parts, further, press onto the top of the heat sink to tightly and closely attach the heat sink and the chipset. The heat sink may include a hole which is drilled for the protruding rod to penetrate in order to position the fix base and the heat sink.

6 Claims, 5 Drawing Sheets

FIX BASE OF INTEGRATED CIRCUIT CHIPSET AND HEAT SINK

FIELD OF THE INVENTION

The present invention relates to an improved fix base, and more specifically, to a fix base used to fix an integrated circuit chipset and a heat sink dissipating the heat generated by the chipset in a PC (personal computer).

BACKGROUND OF THE INVENTION

A chipset in a PC (e.g., BGA, QFP, and CPU) may generate much heat when operating and it is necessary to dissipate the heat on time to avoid the degradation of the performance and the burn-out of the chipset. It is more important for a high-speed chipset generating much more heat. Hence, almost every host computer needs a heat sink device to dissipate all the heat generated by the chipset.

A heat sink device is commonly used for a higher speed chipset and installed by directly placing a heat dissipating plate with a plurality of fins on the chipset. A fan may also be used to assist heat dissipation. The heat generated by the chipset while operating is absorbed by the heat sink and the fan automatically turned on by the chipset under operation blows the heat sink and makes it cool down rapidly.

A heat-dissipating device in the prior arts is assembled with the chipset by using a metal plate to lock and fix the heat sink on the chip base (referred as socket). The above structure using a metal elastic plate to lock and fix the heat sink on the chip base is complicated and inconvenient to assemble. Therefore, such that the manufacturing cost increases and elasticity fatigue which causes the heat sink to malfunction occurs easily. Furthermore, the heat-dissipating device may be loosened while the computer is loaded and unloaded in delivery. The delicate and fragile chipset may be damaged if the operator asserts too much force. In addition, the metal elastic plate may have no place to lock if a BGA base instead of a chip base (socket) is used to connect the chipset and the motherboard, or the chipset is directly mounted on the motherboard.

The space between the chipset and the motherboard is only about 0.25 mm in height when the chipset is mounted on the motherboard. No manufacturer takes this limited space into consideration to improve the heat dissipation. An adhesive tape is generally used to attach the bottom of the heat sink and the top of the chipset, or a screw may be used to lock the heat sink on the motherboard. The adhesive tape, however, easily becomes aged and not adhesive under high temperature condition of operation. Therefore, some manufacturers require the motherboard vendor to reserve a hole for the screw. Using a screw has better performance than an adhesive tape but it is difficult in practice to reserve the hole for the screw because it may not be suitable for all designs of circuit layout, and not all motherboard vendors can reserve the hole on the motherboard. Additionally, the cost of assembling is higher. Consequently, manufacturing motherboards with a hole reserved for a screw to lock a heat sink is not popular.

FIG. 5 shows an improved structure disclosed in the prior arts to overcome the shortcomings in assembling a traditional chipset and a heat sink so as to accommodate all types of motherboards. The fix base A of the heat sink provided by the disclosed structure includes a hole A0 in the central part with four side plates. All on the four sides. The heat sink B is inserted upwards through the hole on the fix base A and then the plate body of the heat sink B stops at the edge of the hole A0. A fastening hook of the fix base clamps the two opposite sides of the chipset 3 in order to prevent the heat sink and the fix base from sliding and thereby fix them.

Although the above prior art can assemble and fix the heat sink and the fix base on the motherboard, the manufactured heat sink often has a rough bottom surface to which the chipset can not be tightly attached for dissipating heat efficiently. Each of the four sides has a side plate in the above structure. Two opposite sides are used to clamp two respective sides of the chipset and stop the two sides of the heat sink, and the other two sides cross the top of the heat sink. Thus, a slot B1 located between the fin of the heat sink through the two sides is needed. Four side plates of the fix base, however, are of the same height. Therefore, a slot hole B2 located on the slot of the heat sink to be inserted by the side plate is needed for the heat sink and the fix base be assembled. Thus, the other two side plates may be inserted through the slot hole to assemble the fix base and the heat sink when the two sides of the chipset are clamped by the side plates with fastening hooks. As a result, the efficiency of heat dissipation reduces due to reduction in the area for conducting heat after the slot hole is formed in the heat sink.

SUMMARY OF THE INVENTION

An object of the present invention is to provide an improved fix base for the chipset and the heat sink, which has a special structure for more tightly attaching the heat sink to the chipset when the chipset and the heat sink are assembled, and thereby increase the efficiency of heat dissipation.

Another object of the present invention is to provide an improved fix base for the chipset and the heat sink, which does not reduce the efficiency of heat dissipation when it is assembled with the heat sink.

Accordingly, the improved fix base for the chipset and the heat sink provided by the present invention includes a rectangular frame, which has two side plates extending downwards below the bottom of the two respective sides. Each bottom part of the two opposite inner sides of the two side plates has a fastening hook. Each of the other two sides of the two side plates has a protruding rod extending downwards. A plurality of elastic rods are included in the inner side walls, and each elastic rod includes a protruding part at the bottom. The heat sink is inserted into the rectangular frame and then the chipset is hooked at the two respective sides by the fastening hooks. The protruding parts, further, press onto the top of the heat sink to tightly and closely attach the heat sink and the chipset. The heat sink may include holes which are drilled for the protruding rods to be inserted in order to position the fix base and the heat sink.

The above features and other advantages of the present invention will become more apparent according to the detailed description below with reference to the accompanying drawings.

DETAILED DESCRIPTION OF THE PREFERRED EMBODIMENTS

Figure 1:
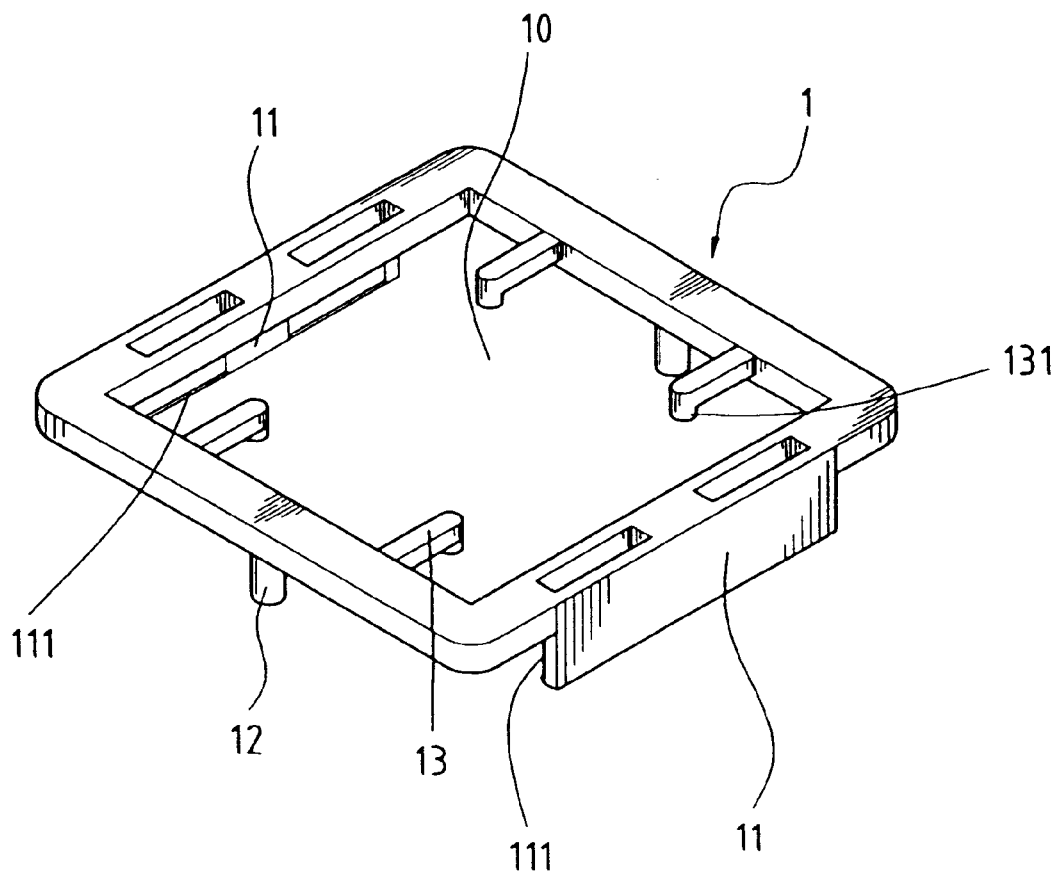
FIG. 1 shows a three-dimensional schematic diagram of the fix base according to the present invention.

With reference to FIG. 1, the improved fix base 1 for the chipset and the heat sink provided by the present invention is a rectangular frame with an inner rectangular hole 10.

The rectangular frame has two side plates 11 extending downwards below the bottom of two opposite sides. Each bottom part of the two opposite inner sides of the two side plates 11 has a fastening hook 111.

Each of the other two sides of the rectangular frame has a protruding rod 12 extending downwards. The preferred length of the protruding rod is not smaller than the height of the side plate 11. A plurality of elastic rods 13 are included in the inner side walls of two sides of the rectangular frame. Each elastic rod 13 includes a protruding part 131 at the bottom. In one preferred embodiment of the present invention, the elastic rods 13 are located on the two sides on which no side plate 11 is located. Further, the elastic rods 13 are perpendicular to the inner side wall of the rectangular frame.

Figure 2:
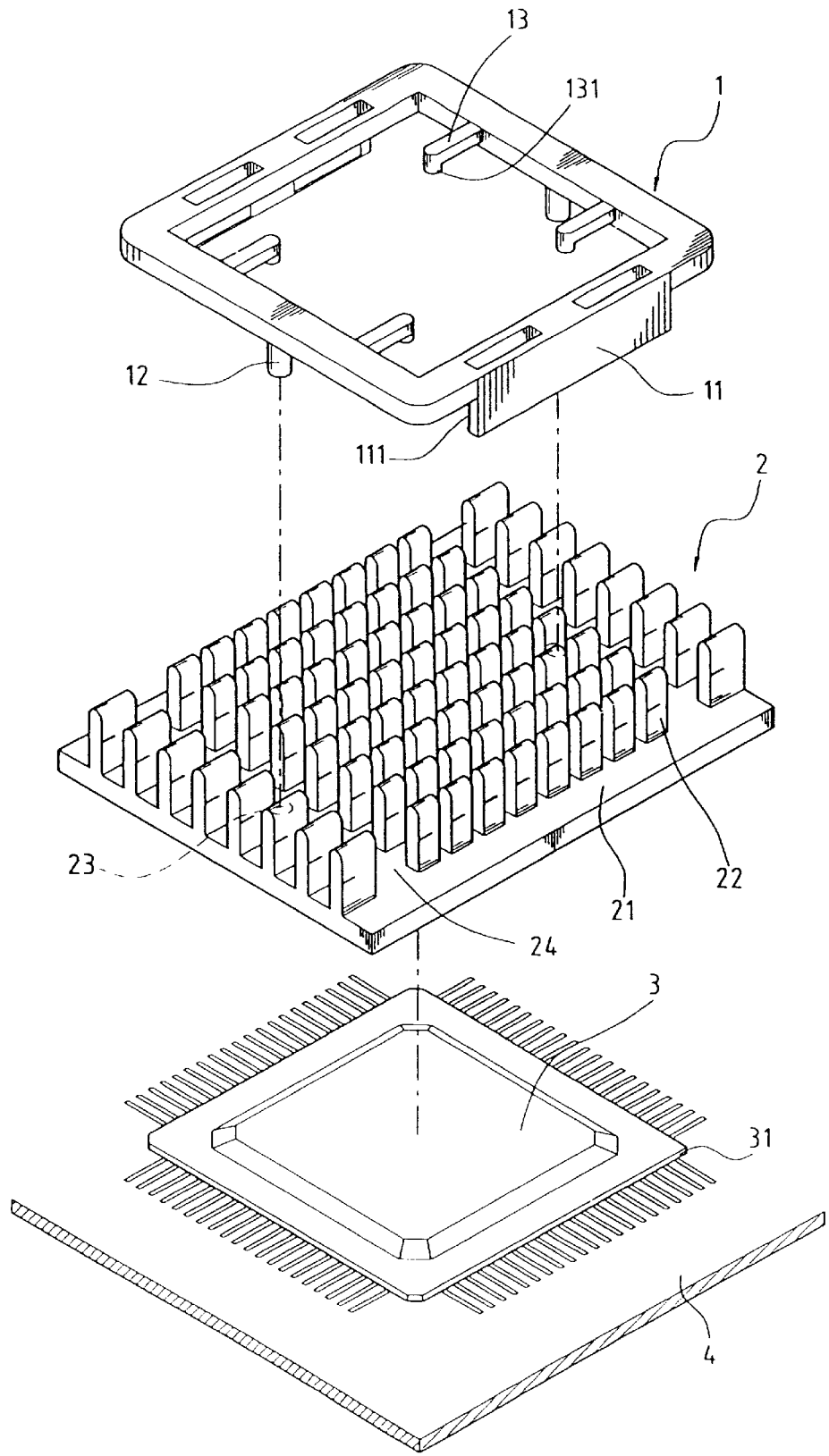
FIG. 2 is an exploded view of the fix base for the heat sink and the chipset according to the present invention.
Figure 3:
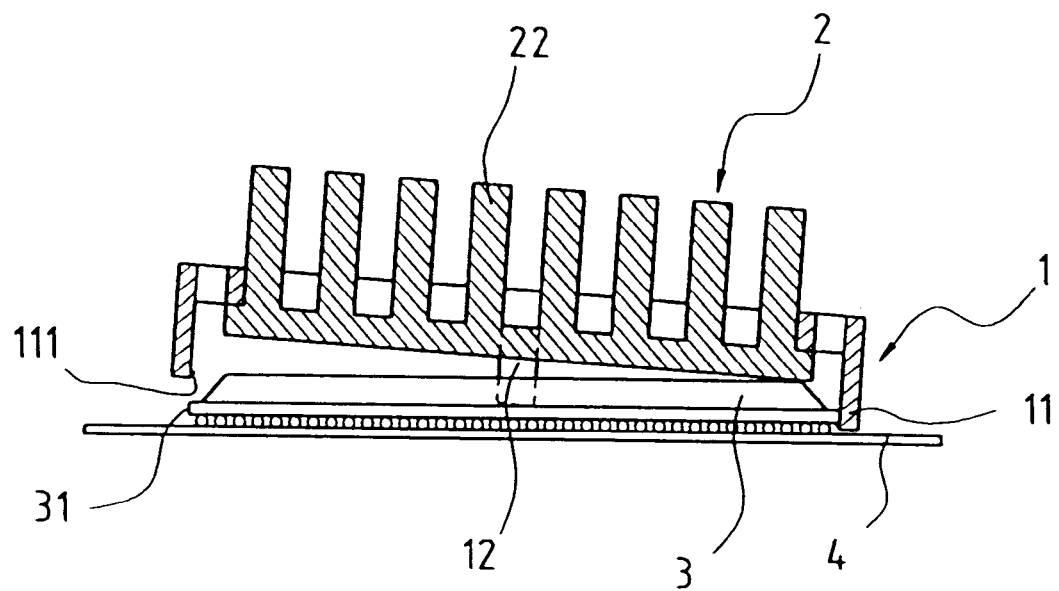
FIG. 3 shows a front view of FIG. 2 after being assembled.
Figure 4:
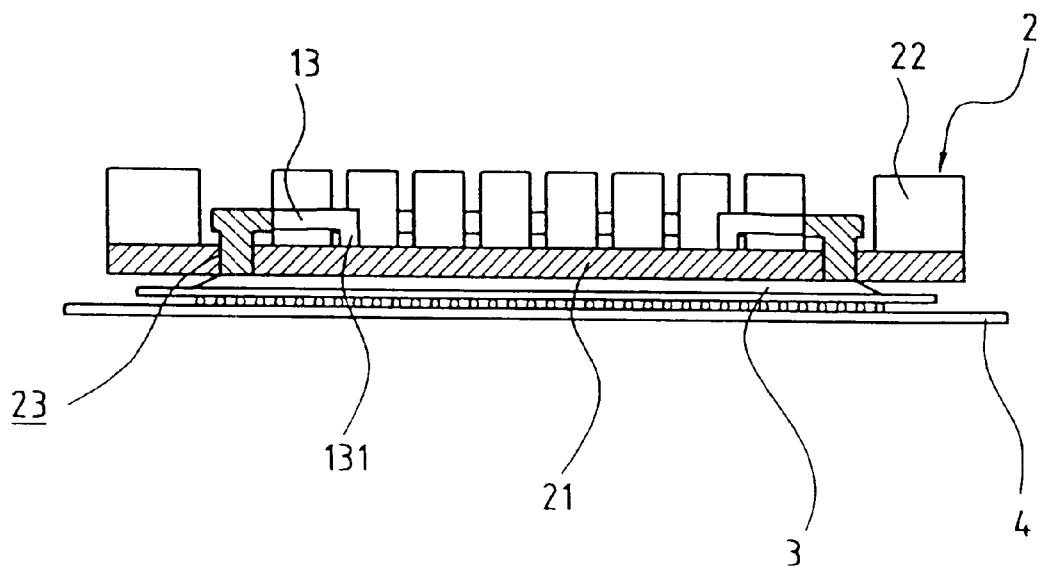
FIG. 4 shows a side view of FIG. 2 after being assembled.
Figure 5:
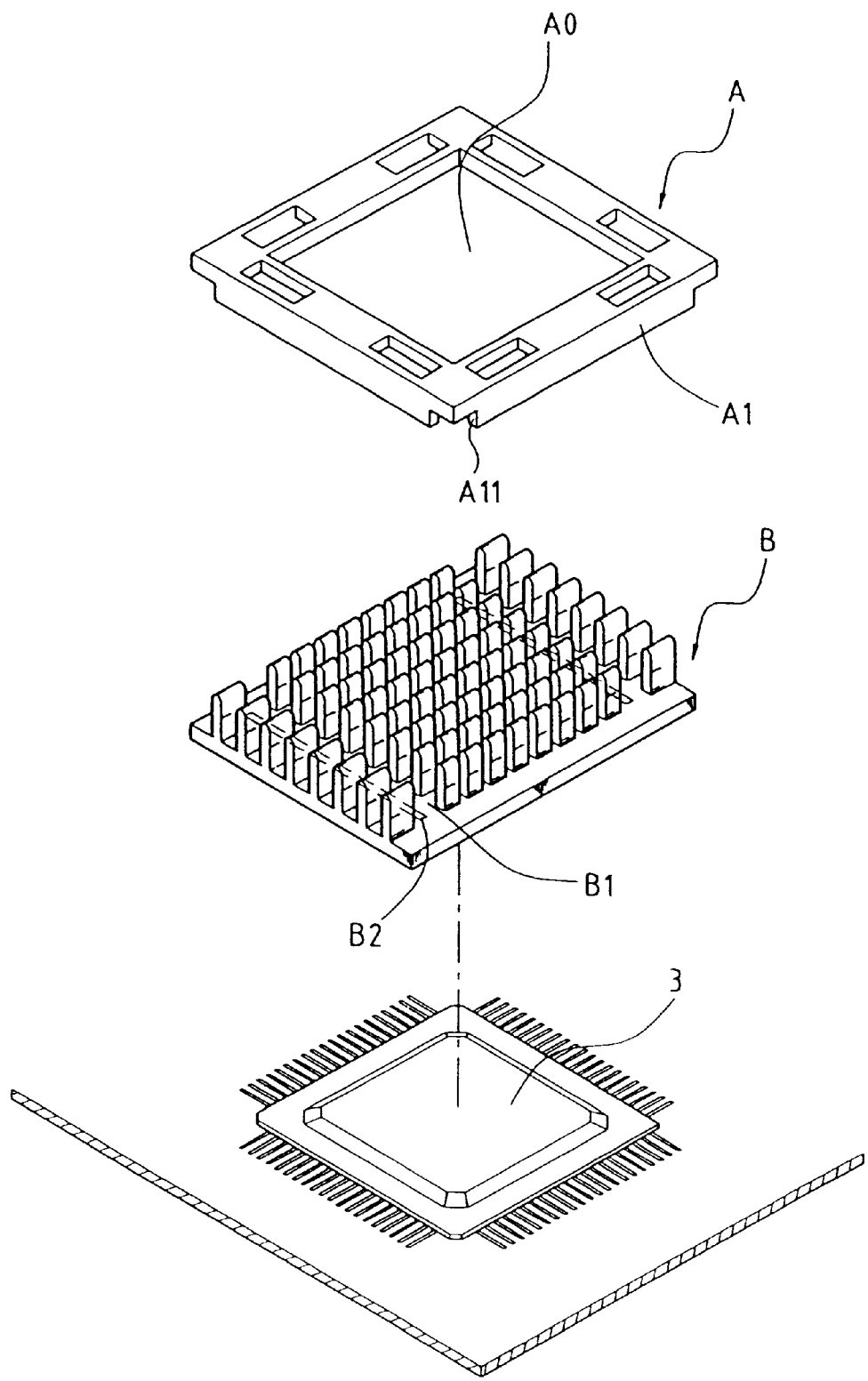
FIG. 5 is an exploded view of the fix base, the heat sink, and the chipset in a prior art.

With reference to FIG. 2, the heat sink 2 corresponding to the fix base 1 of the present invention consists of a rectangular plate 21 larger than the above rectangular hole. The rectangular plate 21 has a plurality of fins 22 which form a slot channel 24 to accommodate the rectangular frame in the fix base 1. Additionally, a traditional chipset 3 is mounted on the circuit board 4. The pins of the chipset 3 soldered on the circuit board 4 have a defined height (about 0.25 mm) and thus an appropriate space is located between the chipset 3 and the circuit board 4. The assembling procedure is to insert the fins 22 of the heat sink 2 upwards through the rectangular hole 10 of the fix base 1 until the rectangular plate 21 of the heat sink 2 stops at the edge of the rectangular hole 10. Then, the chipset 3 is hooked at the edges of the two respective sides 31 by the fastening hooks 111 of the fix base 1. Each protruding rod 12 is inserted into an insertion hole 23 drilled in advance on the slot channel 24 of the heat sink 2 so that the protruding parts 131 of the elastic rods 13 press onto the top of the heat sink 2. Therefore, the fix base 1, the heat sink 2, and the chipset 3 can be rapidly, tightly, and closely attached together (as shown in FIGS. 3 and 4). On the contrary, the dissembling procedure to unload the heat sink 2 is just to pull up the fix base 1 upwards so that the fastening hooks 111 disconnect with the chipset 3. The assembling and dissembling processes are more efficient than that of the prior arts. The whole structure of the present invention is simple enough to reduce the cost of manufacturing. The fix base of the present invention, hence, has at least the following advantages:

1. The protruding parts 131 of the elastic rods 13 press the heat sink 2 onto the top of the chipset 3 to make the heat sink 2 and the chipset 3 tightly and closely attached together so that the shortcoming of the poor contact due to the rough surface of the heat sink is improved and the efficiency of heat dissipation of the heat sink is increased.

2. The fix base corresponding to the heat sink is installed just by drilling small insertion holes on the slot channels of the heat sink to allow the insertion of the protruding rods of the fix base through the insertion holes. The material drilled away from the heat sink to form the small insertion holes is less than that of the traditional slot holes. Thus, the insertion holes have only little effect on the efficiency of heat dissipation of the heat sink.

Although only the preferred embodiments of this invention were shown and described in the above description, it is requested that any modification or combination that comes within the spirit of this invention be protected.

What is claimed is:

1. A fix base of a heat sink, comprising:
   a substantially rectangular frame having four side portions surrounding a substantially rectangular hole;
   two side plates each extending downwards from one of two opposite side portions of said four side portions and having a bottom with a fastening hook formed thereon;
   at least one protruding rod extending downwards from said rectangular frame to be inserted into a hole formed on said heat sink; and
   a plurality of elastic rods extending sidewards from said rectangular frame into said rectangular hole, each elastic rod having a first end connected to one of said four side portions and a second end having a protrudent bottom part for pressing said heat sink.

2. The fix base as claimed in claim 1, wherein said at least one protruding rod is connected to a side portion of said rectangular frame that does not have a side plate extending downwards.

3. The fix base as claimed in claim 1, wherein said plurality of elastic rods are connected to two side portions of said rectangular frame that do not have side plates extending downwards.

4. The fix base as claimed in claim 1, wherein said plurality of elastic rods are connected to said two opposite side portions having side plates extending downwards.

5. The fix base as claimed in claim 1, said plurality of elastic rods and said rectangular frame being formed as an integral body.

6. The fix base as claimed in claim 1, said at least one protruding rod, said plurality of elastic rods and said rectangular frame being formed as an integral body.

* * * * *